s010201088B2

United States Patent
Park et al.

(10) Patent No.: US 10,201,088 B2
(45) Date of Patent: Feb. 5, 2019

(54) CONTACT ELEMENT AND CONTACT STRUCTURE FOR ELECTRONIC DEVICE

(71) Applicant: SAMSUNG ELECTRONICS CO., LTD., Suwon-si (KR)

(72) Inventors: Jin Yong Park, Suwon-si (KR); Jeong Geun Kim, Suwon-si (KR); Si Young Park, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/689,206

(22) Filed: Aug. 29, 2017

(65) Prior Publication Data
US 2018/0098431 A1  Apr. 5, 2018

(30) Foreign Application Priority Data
Sep. 30, 2016 (KR) .......................... 10-2016-0126976

(51) Int. Cl.
*H01R 9/00* (2006.01)
*H05K 1/18* (2006.01)
(Continued)

(52) U.S. Cl.
CPC .............. *H05K 1/184* (2013.01); *H01R 4/58* (2013.01); *H05K 1/0213* (2013.01); *H05K 1/115* (2013.01);
(Continued)

(58) Field of Classification Search
CPC ........ H01R 4/58; H05K 1/0213; H05K 1/115; H05K 1/145; H05K 1/184; H05K 2201/09072; H05K 2201/09754; H05K 2201/0999; H05K 2201/10189; H05K 2201/1028; H05K 2201/10295; H05K 2201/10303; H05K 2201/10
See application file for complete search history.

(56) References Cited

U.S. PATENT DOCUMENTS 4,927,367 A *  5/1990  Salvagno ............. H05K 9/0039
                                                     200/507
5,833,480 A * 11/1998  Austin .................... H01R 4/64
                                                      439/95

(Continued)

FOREIGN PATENT DOCUMENTS

KR  10-1178869 B1  9/2012

OTHER PUBLICATIONS

Communication dated Feb. 26, 2018, issued by the European Patent Office in counterpart European Patent Application No. 17188408.3.

*Primary Examiner* — Yuriy Semenenko
(74) *Attorney, Agent, or Firm* — Sughrue Mion, PLLC

(57) ABSTRACT

In accordance with an aspect of the present disclosure, a contact structure for an electronic device may include a printed circuit board (PCB) including at least one hole vertically formed through the PCB, a housing (e.g., a mechanical part) on which the PCB is seated, and a contact element, at least part of which is brought into contact with the housing disposed on a side of the hole of the PCB and below the same. The contact element may include a contact part soldered on a peripheral portion around the hole, and a protrusion passing through the hole and making contact with the housing disposed below the PCB.

20 Claims, 15 Drawing Sheets

(51) Int. Cl.
*H01R 4/58* (2006.01)
*H05K 1/11* (2006.01)
*H05K 3/34* (2006.01)
*H05K 1/02* (2006.01)
*H05K 7/14* (2006.01)
*H05K 1/14* (2006.01)

(52) U.S. Cl.
CPC ............ *H05K 3/341* (2013.01); *H05K 7/142* (2013.01); *H05K 1/145* (2013.01); *H05K 3/3457* (2013.01); *H05K 2201/09072* (2013.01); *H05K 2201/0999* (2013.01); *H05K 2201/09754* (2013.01); *H05K 2201/1028* (2013.01); *H05K 2201/10189* (2013.01); *H05K 2201/10295* (2013.01); *H05K 2201/10303* (2013.01); *H05K 2201/10409* (2013.01)

(56) References Cited

U.S. PATENT DOCUMENTS

| | | | | |
|---|---|---|---|---|
| 5,978,232 | A * | 11/1999 | Jo ............................ | H05K 7/142 211/41.17 |
| 6,016,089 | A * | 1/2000 | Goudie .................... | H01R 4/64 333/12 |
| 6,019,614 | A * | 2/2000 | Baur ..................... | H05K 9/0039 439/883 |
| 7,385,830 | B2 * | 6/2008 | Liu ......................... | H05K 7/142 174/138 R |
| 2008/0106358 | A1 * | 5/2008 | Katagiri ................. | H05K 9/006 334/85 |
| 2015/0229076 | A1 * | 8/2015 | Lee ...................... | H01R 13/658 439/82 |

* cited by examiner

CONTACT ELEMENT AND CONTACT STRUCTURE FOR ELECTRONIC DEVICE

CROSS-REFERENCE TO RELATED APPLICATION(S)

This application claims the benefit under 35 U.S.C. § 119(a) of a Korean patent application filed on Sep. 30, 2016 in the Korean Intellectual Property Office and assigned Serial number 10-2016-0126976, the entire disclosure of which is hereby incorporated by reference.

TECHNICAL FIELD

Various embodiments of the present disclosure relate to a ground for an electronic device.

BACKGROUND

With the development of small-sized and high-speed electronic devices, printed circuit boards (PCBs) have decreased in size, and the complexity thereof has increased. The high operating speed of electronic devices may increase the clock frequency of components used in PCBs, thereby causing noise for signals.

To prevent noise and stabilize signals, a ground of an electronic device may be expanded by allowing a PCB ground to make contact with the housing of the electronic device.

In the related art, a PCB may be brought into contact with a housing through a detachable member, such as a gasket. The detachable member, such as a gasket, is manually attached to the housing, which may lead to an increase in process time and cost and may increase a process error rate.

SUMMARY

Aspects of the present disclosure are to address at least the above-mentioned problems and/or disadvantages and to provide at least the advantages described below. Accordingly, an aspect of the present disclosure is to provide a contact element and a contact structure that support contact between a PCB ground and a housing ground.

In accordance with an aspect of the present disclosure, a contact structure for an electronic device may include a printed circuit board (PCB) including at least one hole vertically formed through the PCB, a housing (e.g., a mechanical part) on which the PCB is seated, and a contact element, at least part of which is brought into contact with the housing disposed on a side of the hole of the PCB and below the same. The contact element may include a contact part soldered on a peripheral portion around the hole, and a protrusion passing through the hole and making contact with the housing disposed below the PCB.

In accordance with another aspect of the present disclosure, a contact element may include a contact part disposed on a side of a hole in a printed circuit board (PCB) and soldered on a peripheral portion around the hole to make contact with the PCB, and a protrusion passing through the hole and making contact with a housing disposed on a side of the hole of the PCB and below the same, the PCB being seated on the housing.

In accordance with another aspect of the present disclosure, a contact structure for an electronic device may include a PCB including a hole, a housing disposed on a side of the PCB and facing the hole, the PCB being seated on the housing, and a contact element, at least a portion of which contacts the housing. The contact element may include a contact portion soldered onto a peripheral portion of the PCB, the peripheral portion being disposed around the hole, and a protrusion passing through the hole and contacting the housing.

The PCB may further include a plurality of pads formed on a ground of the PCB, and the contact portion may be configured to be soldered onto the plurality of pads.

The contact portion may further include a first region having a specified polygonal shape and a plurality of second regions extending from the first region, the plurality of second regions being spaced apart from one another to abut the first region. The protrusion may extend from a coupling portion where the first region and the plurality of second regions join together, in a direction away from the contact portion.

The protrusion may have a length exceeding a thickness of the PCB.

The hole may have a first width in a first direction and a second width in a second direction, the second direction being orthogonal to the first direction. The first width may be greater than or equal to a width of the protrusion in the first direction. The second width may be greater than or equal to a distance between first and second ends of the protrusion in the second direction.

The protrusion may have a width corresponding to a gap between the plurality of second regions.

The protrusion may extend from the contact portion at an angle of less than 90 degrees with respect to the contact portion.

The protrusion of the contact element may have an elastic force.

The housing may be secured to the PCB using a plurality of coupling members. The housing may contact a ground of the PCB using the plurality of coupling members. The contact element may be located between the plurality of coupling members.

The housing may further include a projection configured to projected toward a surface of the PCB.

The protrusion may contact a side surface of the projection.

The protrusion may be bent in a shape corresponding to the side surface of the projection.

The housing may further include a plurality of projections formed at multiple positions to balance the PCB on the housing. The contact structure may further include a plurality of contact elements formed at a plurality of positions on the PCB that correspond to the plurality of projections.

In accordance with another aspect of the present disclosure, a contact element may include a contact portion disposed on a side of a hole in a printed circuit board (PCB) and soldered onto a peripheral portion of the PCB, the peripheral portion being disposed around the hole, and a protrusion passing through the hole and contacting a housing disposed on a side of the PCB and facing the hole, the PCB being seated on the housing.

The contact portion may further include a first region having a specified polygonal shape and a plurality of second regions extending from the first region, the plurality of second regions being spaced apart from one another to abut the first region. The protrusion may extend from a coupling portion where the first region and the plurality of second regions join together, in a direction away from the contact portion.

The protrusion may have a width corresponding to a gap between the plurality of second regions and a length exceeding a thickness of the PCB.

The hole may have a first width in a first direction and a second width in a second direction, the second direction being orthogonal to the first direction. The first width may be greater than or equal to a width of the protrusion in the first direction. The second width may be greater than or equal to a distance between first and second ends of the protrusion in the second direction.

The protrusion may have a width corresponding to a gap between the plurality of second regions.

The first region may have an area sufficient to enable a pick-and-place machine to pick up the contact element using surface mount technology (SMT).

The protrusion may extend from the contact portion at an angle of less than 90 degrees with respect to the contact portion.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Figure 2A:
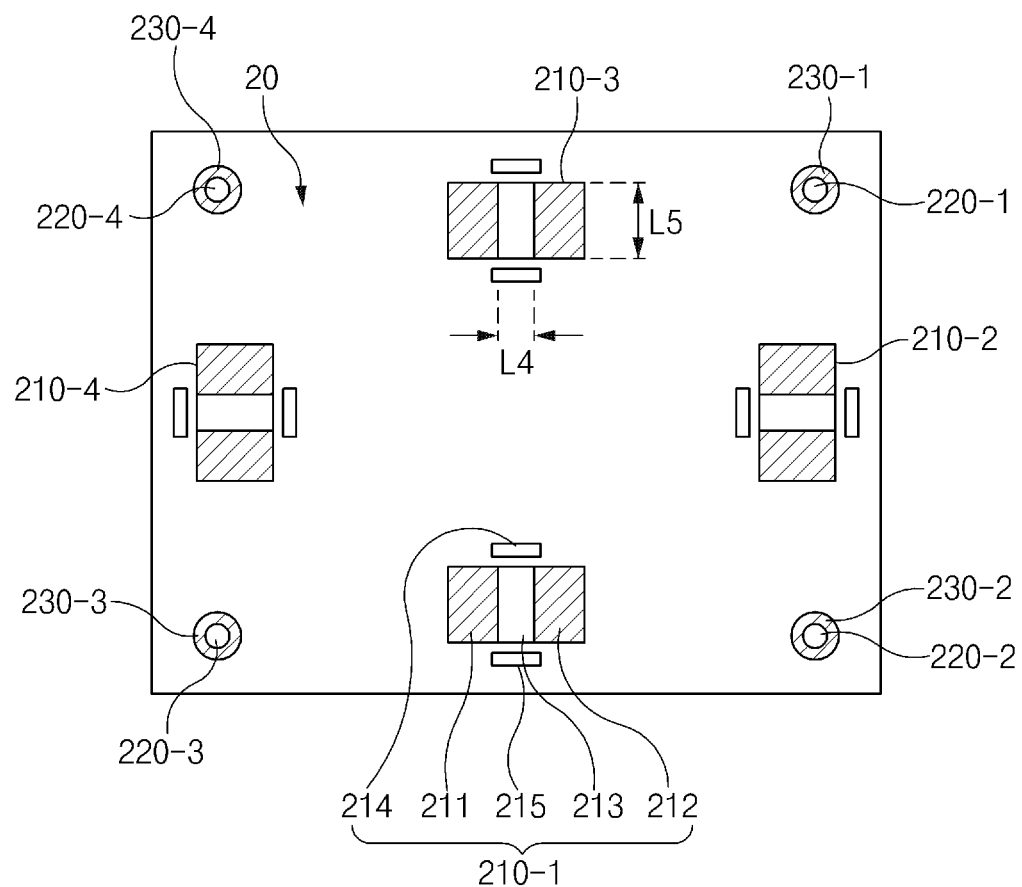
Figure 2B:
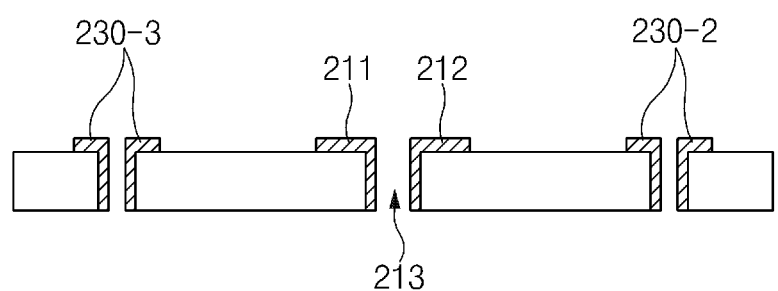
Figure 3A:
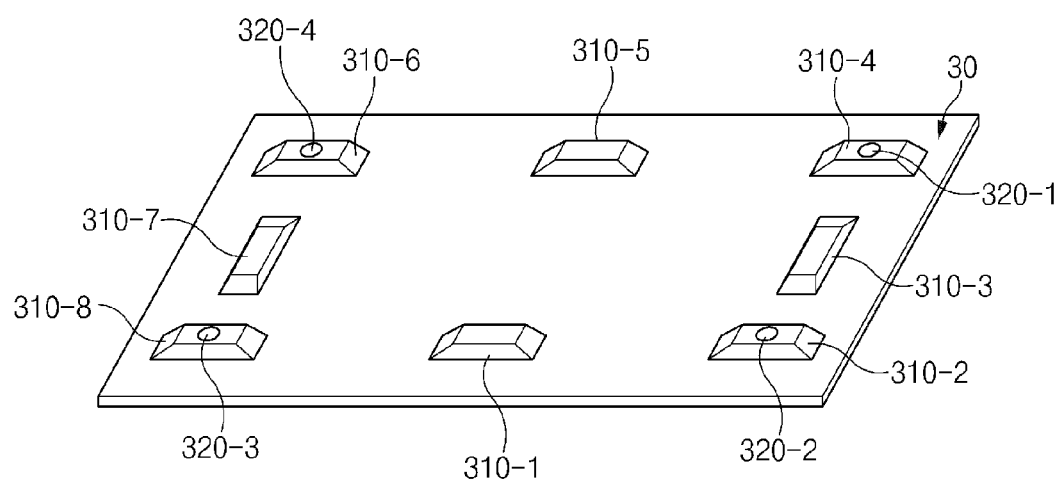
Figure 3B:
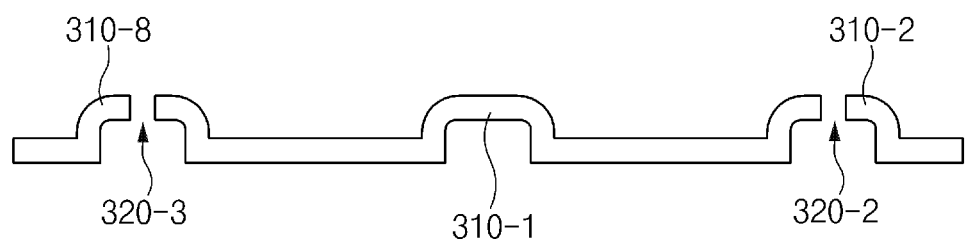
Figure 4A:
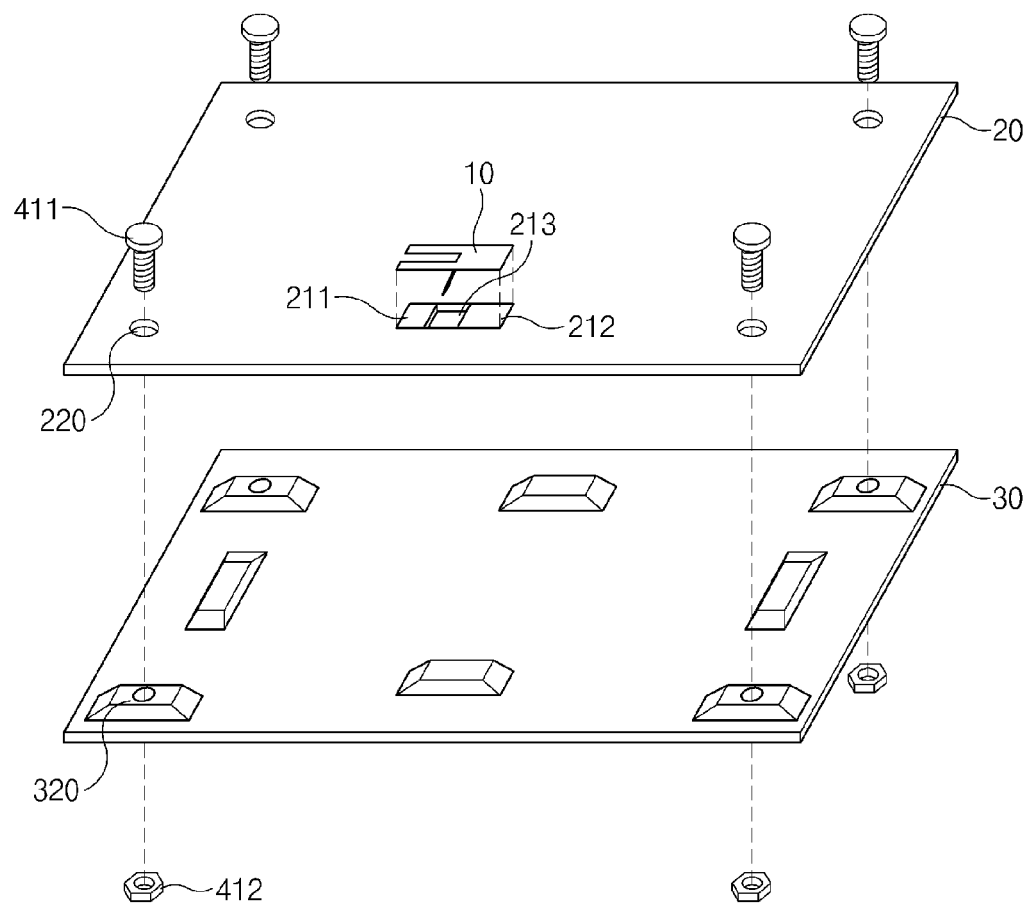
Figure 4B:
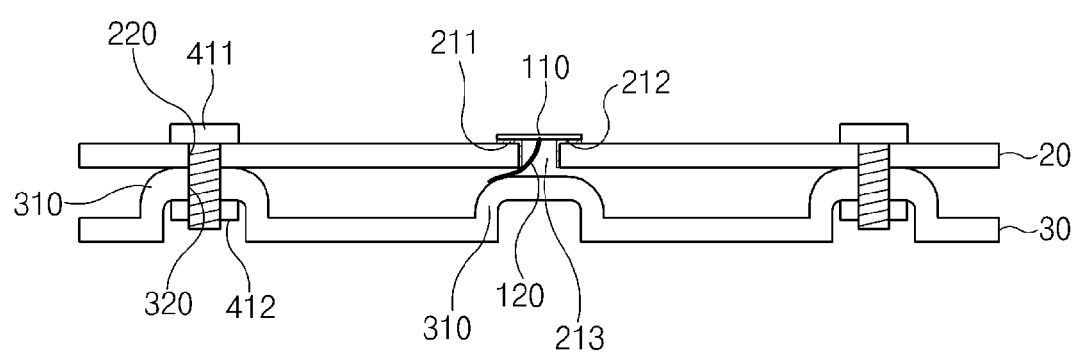
Figure 4C:
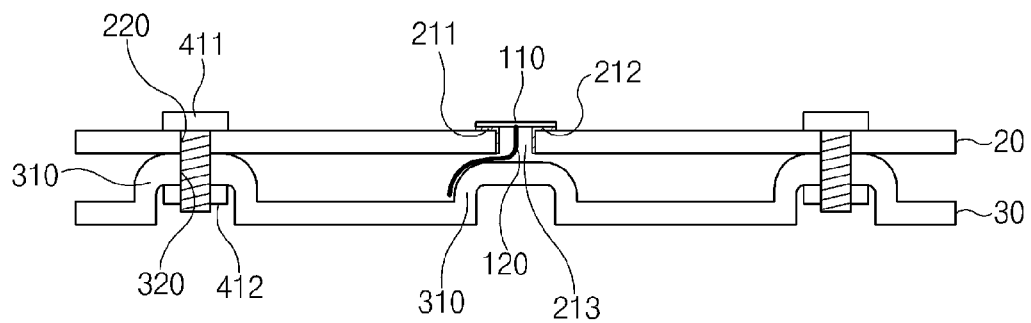
Figure 4D:
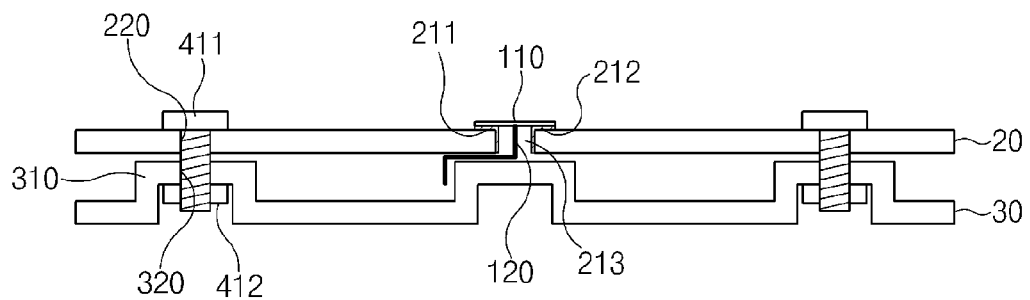
Figure 5A:
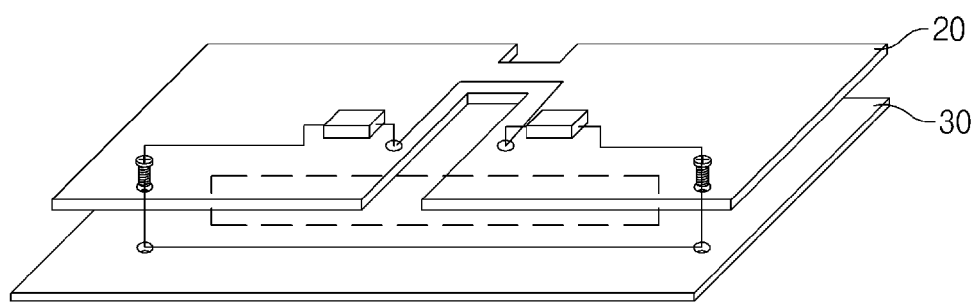
Figure 5B:
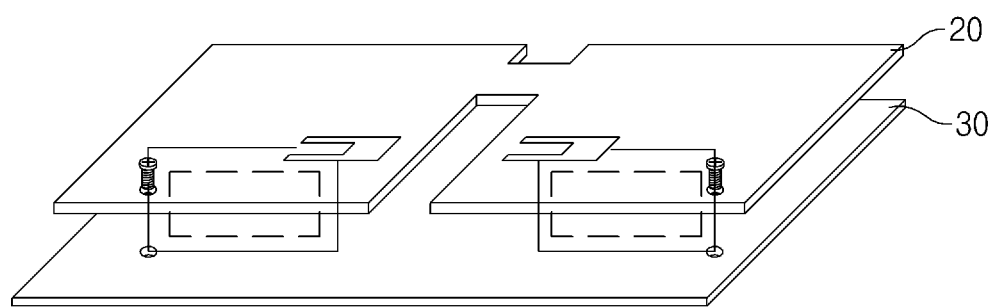
Figure 6:
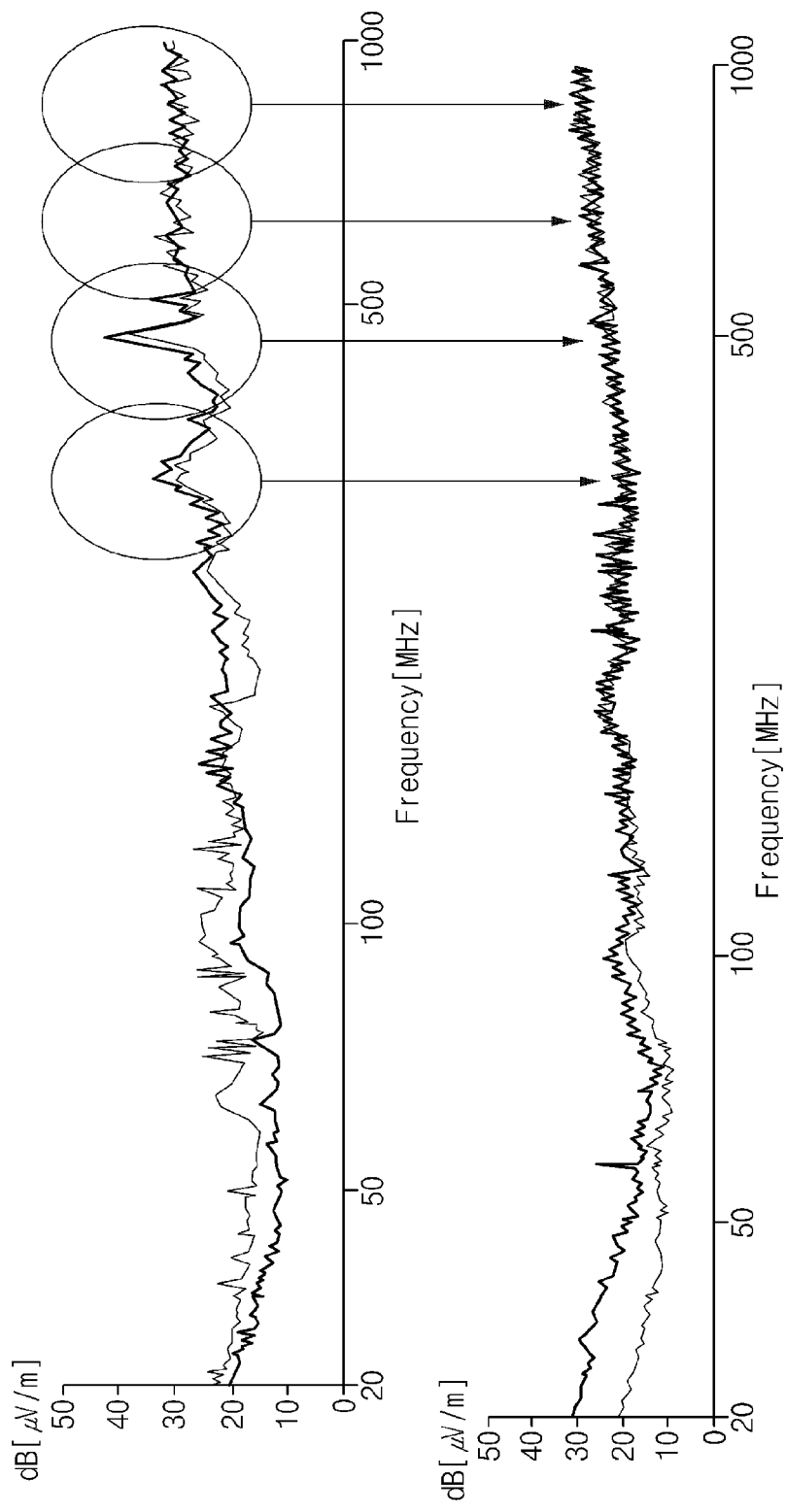

2A is a top view of a PCB according to an embodiment of the present disclosure;

FIG. 2B is a sectional view of the PCB according to an embodiment of the present disclosure;

FIG. 3A is a top view of a mechanical part according to an embodiment of the present disclosure;

FIG. 3B is a sectional view of the mechanical part according to an embodiment of the present disclosure;

FIG. 4A is an exploded perspective view of a contact structure according to an embodiment of the present disclosure;

FIGS. 4B to 4D are sectional views of contact structures according to various embodiments of the present disclosure;

FIG. 5A illustrates a contact structure for allowing a ground of the PCB to make electrical contact with the mechanical part using coupling members;

FIG. 5B illustrates a contact structure for allowing the ground of the PCB to make contact with the mechanical part using the coupling members and the contact element according to an embodiment of the present disclosure;

FIG. 6 is a graph comparing the EMI characteristic of a first case electrically contacting the ground of the PCB and the mechanical part by using only the coupling members, and the EMI characteristic of a second case electrically contacting the ground of the PCB and the mechanical part by using the coupling members and the contact element according to an embodiment of the present disclosure.

Throughout the drawings, it should be noted that like reference numbers are used to depict the same or similar elements, features, and structures.

DETAILED DESCRIPTION

Hereinafter, certain embodiments of the present disclosure may be described with reference to accompanying drawings. Accordingly, those of ordinary skill in the art will recognize that modifications, equivalents, and/or alternatives on the various embodiments described herein may be made without departing from the scope and spirit of the present disclosure. With regard to the description of drawings, similar elements may be marked by similar reference numerals.

Various embodiments of the present disclosure may provide a structure for expanding a ground of a printed circuit board (PCB) by allowing the PCB ground to make contact with a ground of a mechanical part using a contact element. Hereinafter, the structure of the contact element, the PCB, and the mechanical part will first be described separately, and then a contact structure between the contact element, the PCB, and the mechanical part will be described.

Figure 1A:
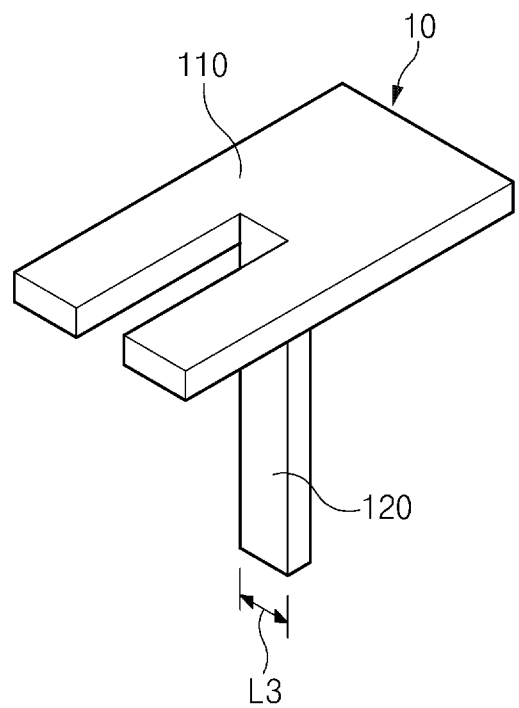
FIG. 1A is a perspective view of a contact element according to an embodiment of the present disclosure.
Figure 1B:
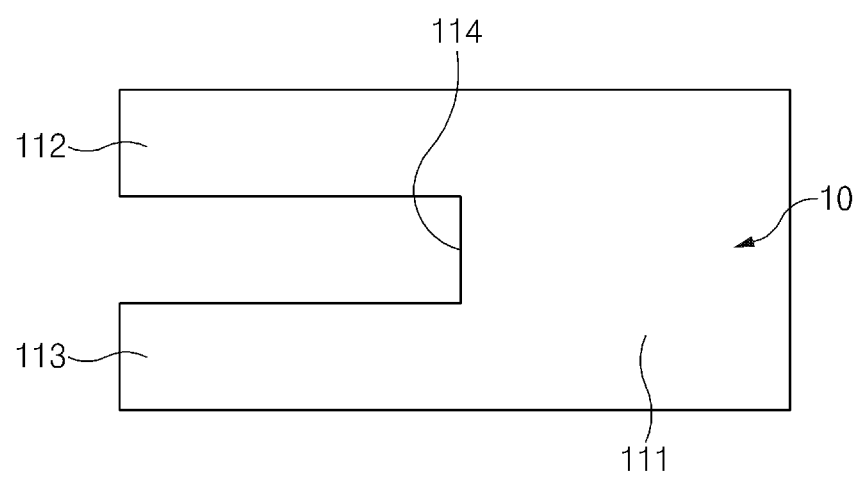
FIG. 1B is a top view of the contact element according to an embodiment of the present disclosure.
Figure 1C:
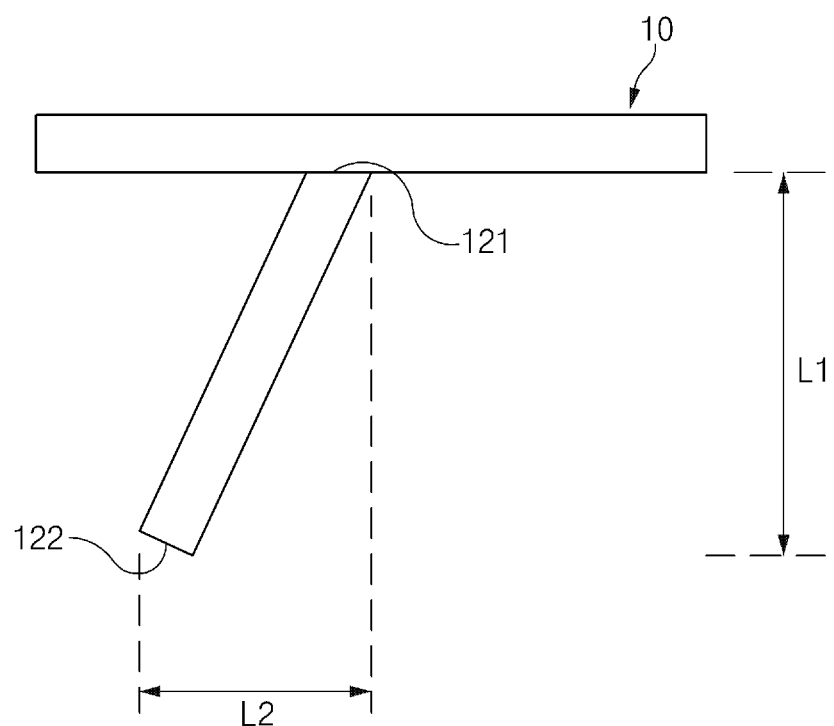
FIG. 1C is a side view of the contact element according to an embodiment of the present disclosure.

FIG. 1A is a perspective view of a contact element according to an embodiment of the present disclosure, FIG. 1B is a top view of the contact element according to an embodiment of the present disclosure, and FIG. 1C is a side view of the contact element according to an embodiment of the present disclosure.

Referring to FIGS. 1A to 1C, according to an embodiment of the present disclosure, a contact element 10 may be mounted and soldered on a ground of a PCB 20 (see FIG. 2A) to allow the ground of the PCB 20 to make contact with a mechanical part 30 (see FIG. 3A). Since the contact element 10 is mounted and soldered by surface mount technology (SMT), the contact element 10 may have a size sufficient to ensure a region that is to be picked up by a vacuum pick-and-place machine in the SMT. For example, a relatively large region of the contact element 10 (e.g., the first region of FIG. 1B) that makes close contact with the PCB 20 may have a size of 1.0 mm×1.0 mm or more.

According to an embodiment of the present disclosure, the contact element 10 may be broadly divided into a contact portion, e.g., a contact part 110 and a protrusion 120 extending from the contact part 110. In one embodiment, the contact part 110 of the contact element may be brought into contact with the first surface (e.g., the top surface) of the PCB 20 and soldered thereon by SMT. At least the bottom surface of the contact part 110 may have a flat shape so as to increase the contact area with the PCB 20.

In one embodiment, the contact part 110 may be divided into, for example, the first, second, and third regions 111, 112, and 113. The first region 111 of the contact element, which may be picked up by a vacuum pick-and-place machine in SMT, may have a polygonal shape, for example. The second and third regions 112 and 113 of the contact element, which extend from the first region 111, may be spaced apart from each other and may abut the first region 111. The second and third regions 112 and 113 of the contact element may abut the first region 111 of the contact element so as to be parallel thereto. While the contact element constituted by the first to third regions is exemplified in this specification, the shape of the contact element may not be limited thereto.

For example, the contact part 110 of the contact element may have an overall rectangular shape or a shape similar thereto, and the length of the contact part 110 in a vertical direction as shown in FIG. 1B may be one third of the length thereof in a horizontal direction as shown in FIG. 1B. As illustrated in FIG. 1B, the first region 111 of the contact element may have a square shape, and the second and third regions 112 and 113 of the contact element may have a rectangular shape. The second and third regions 112 and 113 may be spaced apart from each other by a width L3 of the protrusion of the contact element and may abut the first region 111 so as to be parallel thereto. The contact part 110 may have the shape of " ⊂ " as a whole, as illustrated in FIG. 1B.

In one embodiment, the protrusion 120 of the contact element may be brought into contact with the mechanical part 30 through a hole 213 (see FIG. 2A) formed in the PCB 20. To this end, the protrusion 120 of the contact element may extend from a coupling portion 114 of the contact element in a direction away from the contact part 110, and may be sufficiently long that the protrusion 120 may be brought into contact with the mechanical part 30 through the hole 213 formed in the PCB 20. For example, the protrusion 120 of the contact element may have a length in a vertical direction L1 (see FIG. 1C) that is twice the thickness of the PCB 20.

In one embodiment, the protrusion 120 of the contact element may have a shape that allows the contact area with the mechanical part 30 to be increased. For example, the protrusion 120 of the contact element may extend from the coupling portion 114 at an angle of, e.g., with a slope less than 90 degrees in a direction away from the contact part 110. The protrusion 120 of the contact element 10 may have a shape corresponding to a contact portion of the mechanical part 30. Other shapes of the protrusion 120 of the contact element will be described below with reference to FIGS. 4A to 4D. The middle portion of the protrusion 120 of the contact element 10, as well as the distal end thereof with respect to the coupling portion 114, may be brought into contact with the mechanical part 30.

According to an embodiment of the present disclosure, the contact element 10 may be formed of a conductive material (e.g., copper). Accordingly, the contact element 10 may be mounted and soldered on the ground of the PCB 20 to allow the ground of the PCB 20 to make contact with the mechanical part 30.

According to an embodiment of the present disclosure, the entire contact element 10 or at least the protrusion 120 may be formed of an elastic material. Accordingly, the protrusion 120 according to an embodiment of the present disclosure may be inserted through the hole 213 of the PCB 20 (see FIG. 2A) and then brought into flexible contact with the mechanical part 30. As a result, the protrusion 120 may not be easily damaged by an external shock, such as pressing of the PCB 20.

Figure 1D:
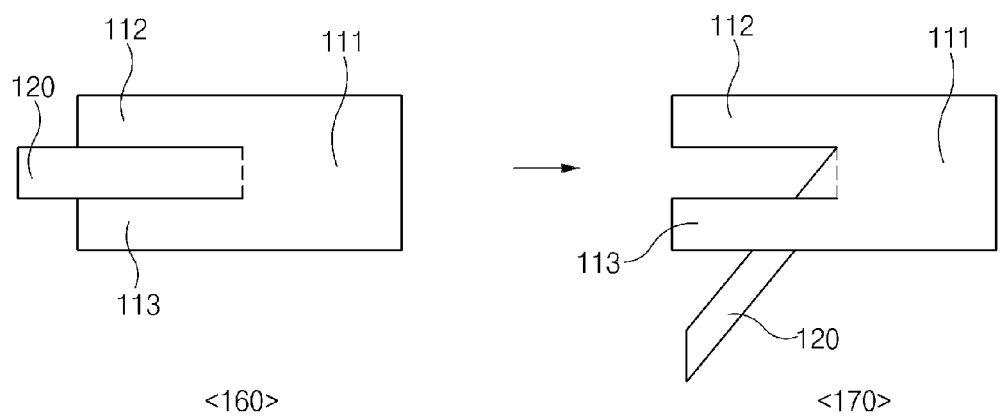
FIG. 1D illustrates a process for the contact element according to an embodiment of the present disclosure.

FIG. 1D illustrates a process for the contact element according to an embodiment of the present disclosure.

Referring to FIG. 1D, the first region 111 and the second and third regions 112 and 113 of the contact element 10 may be formed by cutting a conductive panel into an overall shape similar to "E", as in state 160.

The protrusion 120 of the contact element 10 may be formed by obliquely bending at the coupling portion 114 (shown by a dotted line in FIG. 1D) between the first to third regions 111 to 113 by using a press (or manually), as in state 170.

The contact element according to an embodiment of the present disclosure may be easily produced by automated processes, such as cutting, pressing, and the like.

FIG. 2A is a top view of a PCB according to an embodiment of the present disclosure, and FIG. 2B is a sectional view of the PCB according to an embodiment of the present disclosure.

Referring to FIGS. 2A and 2B, according to an embodiment of the present disclosure, the PCB 20 may be placed on the top surface of the mechanical part 30 and may be secured to the mechanical part 30 by first coupling members 411 (see FIG. 4A). The first coupling members 411 and the portions of the mechanical part 30 that make contact with at least the first coupling members 411 may be formed of a conductive material, and thus the ground of the PCB 20 may make electrical contact with the mechanical part 30 through the first coupling members 411.

According to an embodiment of the present disclosure, the PCB 20 may have at least one contact element 10 mounted on the first surface thereof (e.g., the top surface), and may be placed on the top surface of the mechanical part 30 to allow the second surface thereof (e.g., the bottom surface) to make close contact with the mechanical part 30. The ground of the PCB 20 may make electrical contact with the mechanical part 30 through the contact element 10 and the coupling members 411 and 412.

According to an embodiment of the present disclosure, a component may be mounted on at least one of the first and second surfaces of the PCB 20. For example, a component and the contact element 10 may be mounted on the first surface of the PCB 20. In one embodiment, the PCB 20 may be constituted by two or more layers. The PCB 20 may have a structure for preventing noise and stably ensuring a ground. For example, the PCB 20 may be constituted by four layers: the first layer (surface) (e.g., the top) for component mounting and signal routing; the second layer for signal routing, which includes a ground; the third layer for power routing; and the fourth layer serving as a ground layer.

According to an embodiment of the present disclosure, the PCB 20 may include a first mounting portion (not illustrated), first fixing holes 220-1 to 220-4 (hereinafter, referred to as "220"), and second mounting portions 210-1 to 210-4 (hereinafter, referred to as "210"). While the four first fixing holes 220 and the four second mounting portions 210 are illustrated in FIGS. 2A and 2B, the present disclosure is not limited thereto. For ease of identification, only the detailed configurations of one second mounting portion 210 are provided with reference numerals in FIGS. 2A and 2B. For the convenience of description, the second mounting portions 210 in FIGS. 2A and 2B are illustrated as occupying almost the entire PCB 20, but the present disclosure is not limited thereto. For example, in practice, the first mounting portion (not illustrated) may occupy almost the entire PCB 20, and the second mounting portions 210 and the first fixing holes 220 may occupy only part of the PCB 20 since the PCB 20 is aimed at mounting components thereon. Hereinafter, the first mounting portion (not illustrated), the first fixing holes 220, and the second mounting portions 210 will be described.

According to an embodiment of the present disclosure, the first mounting portion (not illustrated) may be included in at least one of the first and second surfaces of the PCB 20. Components for driving an electronic device may be mounted on the first mounting portion (not illustrated). For example, the first mounting portion (not illustrated) may occupy almost the entire PCB 20. The first mounting portion (not illustrated) may be in the middle of the PCB 20. Since those skilled in the art could easily derive the shape and configuration of the first mounting portion (not illustrated) from routing technology for the PCB 20, a detailed description thereof will be omitted. Furthermore, in the following description, it will be exemplified that the first mounting portion (not illustrated) is formed on only the first surface of the PCB 20, but the present disclosure is not limited thereto. Examples of the electronic device may include various types of devices, such as a display, a mobile phone, iPod, a smart pad, and the like.

According to an embodiment of the present disclosure, the plurality of first fixing holes 220 and the at least one second mounting portion 210 may be located at the ground of the PCB 20, for example, at the outer peripheral ground portion of the PCB 20 so as not to overlap the first mounting portion (not illustrated).

In one embodiment, the first coupling members 411 may be fastened to the first fixing holes 220 in the PCB 20 to secure the PCB 20 to another member that includes the mechanical part 30. For example, the first coupling members 411 may be inserted through the first fixing holes 220 and coupled with the second coupling members 412 (see FIG. 4A) on the bottom surface of the other member to secure the PCB 20 to the other member.

In one embodiment, the peripheries 230-1 to 230-4 around the first fixing holes 220 of the PCB may be grounds (see 230-1 to 230-4) from which a film has been removed, and the layers inside the first fixing holes 220 may have the form of a ground via. Accordingly, when the first conductive coupling members 411 are inserted through the first fixing holes 220 and the second fixing holes 320 and coupled with the second coupling members 412 on the bottom surface of the mechanical part 30, the first coupling members 411 may allow the ground of the PCB 20 to make electrical contact with the mechanical part 30 through the first surface, the inner layers of the PCB 20 and the second fixing holes 320-1 to 320-4 (hereinafter, referred to as "320"; see FIG. 3A) of the mechanical part 30.

According to an embodiment of the present disclosure, the second mounting portions 210 of the PCB, on which the respective contact elements 10 are mounted, may be formed on the outer periphery of the PCB 20. Each of the second mounting portions 210 may have a plurality of pads 211 and 212, a hole 213, and marks 214 and 215.

In one embodiment, the plurality of pads 211 and 212 of the second mounting portion 210, on which the contact element 10 is mounted and soldered, may be formed on the outer peripheral ground of the PCB 20. The contact part 110 of the contact element may be brought into contact with the plurality of pads 211 and 212 and soldered thereon, and thus the contact element 10 may make electrical contact with the ground of the PCB 20. While the second mounting portion 210 including the two pads is exemplified in this specification, the second mounting portion 210 may include one pad, or two or more pads, depending on the shape of the contact part.

In one embodiment, the hole 213 of the second mounting portion 210 may be provided between the plurality of pads 211 and 212. The hole 213 may be a via hole electrically connected with the grounds in the multiple layers of the PCB 20. The hole 213 may have a size and shape that allows the protrusion 120 of the contact element to be inserted into the hole 213 by SMT. For example, the hole 213 may have a rectangular shape that has a length L4 in a horizontal direction as shown in FIG. 2A greater than or equal to the horizontal width L2 between the first and second ends of the protrusion 120 of the contact element and a length L5 in a vertical direction as shown in FIG. 2A greater than or equal to the width L3 of the protrusion 120 of the contact element. According to an embodiment of the present disclosure, the protrusion 120 of the contact element may deform freely when the protrusion 120 is mounted on the PCB, brought into contact with the mechanical part 30, and pressed by the PCB and the like.

In one embodiment, the marks 214 and 215 of the second mounting portion 210 may be used to determine a portion on which the contact element 10 may be mounted by SMT. For example, the marks 214 and 215 may be provided on a plurality of portions that abut the second mounting portion 210 at locations different from those of the hole 213 and the pads 211 and 212.

According to an embodiment of the present disclosure, examples of the PCB 20 may include various types of substrates, such as a printed circuit board (PCB), a flexible printed circuit board (FPCB), and the like. The PCB 20 may be a main board on which the majority of the components of the electronic device have been mounted, or may be a sub-board on which some of the components of the electronic device have been mounted.

According to another embodiment of the present disclosure, the PCB 20 may further include an attachment portion from which a coating has been removed, to attach a detachable member, such as a gasket, to a region on which the contact element 10 cannot be mounted.

FIG. 3A is a top view of a mechanical part according to an embodiment of the present disclosure, and FIG. 3B is a sectional view of the mechanical part according to an embodiment of the present disclosure.

Referring to FIGS. 3A and 3B, according to an embodiment of the present disclosure, a portion of the mechanical part 30 that makes contact with at least the contact element 10 may be formed of a conductive material. For example, the entire mechanical part 30 may be formed of a conductive material (e.g., iron). The surface of the mechanical part 30 that makes close contact with the contact element 10 may be formed of a conductive material. Alternatively, almost the entire mechanical part 30 may be formed of a non-conductive material, and a conductive material may be coated on the surface of the mechanical part 30 that makes close contact with the contact element 10. When the entire mechanical part 30 is formed of a conductive material as in the former case, the ground of the PCB 20 may be further expanded. In the following description, it will be exemplified that the entire mechanical part 30 is formed of a conductive material.

According to an embodiment of the present disclosure, the mechanical part 30 may have a size and shape that allows the PCB 20 to be easily secured to the mechanical part 30. For example, the mechanical part 30 may have the same shape as, or a shape similar to, that of the PCB 20, and may be larger in size than the PCB 20. In the case where the PCB 20 has a rectangular shape, the mechanical part 30 may have a rectangular shape that is larger than the PCB 20 in size.

According to an embodiment of the present disclosure, the mechanical part 30 may include second fixing holes 320 and one or more projections 310-1 to 310-8 (hereinafter, referred to as "310"). The elements of the mechanical part 30 will hereinafter be described.

In one embodiment, the second fixing holes 320 may be holes through which the first coupling members 411 pass. The second fixing holes 320 of the mechanical part 30 may have a size corresponding to the diameter (or width) of the first coupling members 411, and may be formed in the portions of the mechanical part 30 that correspond to the first fixing holes 220 of the PCB. When the first conductive coupling members 411 are inserted through the first and second fixing holes 220 and 320 and coupled with the second coupling members 412 on the bottom surface of the mechanical part 30, the mechanical part 30 may make electrical contact with the ground of the PCB 20. In the case where the entire mechanical part 30 is formed of a conductive material, when the first coupling members 411 are coupled with the second coupling members 412 through the first and second fixing holes 220 and 320, the ground of the PCB 20 may be expanded by the first and second conductive coupling members 411 and 412, the conductive contact surfaces inside the second fixing holes 320, and the conductive bottom surface of the mechanical part 30 that makes contact with the second coupling members 412.

In one embodiment, the second fixing holes 320 may be formed at multiple positions to stably secure the PCB 20. For example, the second fixing holes 320 may be formed in the four corners of the mechanical part 30 having a rectangular shape.

In one embodiment, the projections 310 may be formed in the regions that include the portions where the second fixing holes 320 are present and the portions where the contact elements 10 are brought into contact. For example, the projections 310 may be formed to correspond to the first fixing holes 220 of the PCB 20. The projections 310 may be formed below the holes 213 through which the protrusions 120 of the contact elements 10 pass. The projections 310 may be contacted with a portion of the PCB bottom surface on which no routing pattern is formed. Therefore, according to an embodiment of the present disclosure, it is possible to prevent the pattern of the PCB 20 from being damaged by the projections 310 of the mechanical part 30.

In one embodiment, the projections 310 may have a shape that allows the contact surface between the contact element 10 and the mechanical part 30 to be increased. For example, the projections 310 may include: a top surface, at least a part of which is parallel to the horizontal plane; and a side surface having a specific slope with respect to the horizontal plane. For example, the projections 310 may have an arch shape, a board shape, or a frusto-pyramidal shape having a horizontal top. Specific shapes of the projections 310 will be described below with reference to FIGS. 4A to 4D.

In one embodiment, at least part of the uppermost portion of the projection 310 is located at each second fixing hole 320 and may be situated in the center of the second fixing hole 320. The projection 310 below the contact element 10 may be located at a position at which the contact area with the protrusion 120 of the contact element 10 is increased. Therefore, according to an embodiment of the present disclosure, it is possible to increase the contact area with the ground of the mechanical part 30 while stably securing the PCB 20. While FIG. 3A illustrates that the projection (e.g., 310-8) located at the second fixing hole 320 and the projection (e.g., 310-1) located below the contact element 10 have the same shape and size, the present disclosure is not limited thereto.

In one embodiment, the projections 310 may be formed by pressing the bottom surface of the mechanical part upwards using a press having a specific shape. In one embodiment, the projections 310 may be formed at multiple positions to balance the PCB 20 on the mechanical part 30. For example, in the case where the second fixing holes 320 are located in the four corners of the mechanical part 30 having a rectangular shape, the projections 310 may be formed between the second fixing holes 320. Therefore, according to an embodiment of the present disclosure, it is possible to stably secure the PCB 20. According to another embodiment of the present disclosure, the projections 310 located at the second fixing holes 320 and the projections 310 to be located below the contact elements 10 may have different shapes.

FIG. 4A is an exploded perspective view of a contact structure according to an embodiment of the present disclosure, and FIGS. 4B to 4D are sectional views of contact structures according to various embodiments of the present disclosure.

Referring to FIGS. 4A and 4B, the contact structure according to an embodiment of the present disclosure may include a contact structure among the contact element 10, the PCB 20, and the mechanical part 30. Since the contact element 10, the PCB 20, and the mechanical part 30 have been described above with reference to FIGS. 1A to 3B, the following description of FIGS. 4A to 4D will be focused on the contact structure among the elements.

According to an embodiment of the present disclosure, the first fixing holes 220 may be formed in the outer peripheral ground of the PCB 20, the interior of each first fixing hole 220 may be a ground via, and a film on the periphery around the first fixing hole 220 may be removed. Furthermore, the second fixing holes 320 may be formed in the mechanical part 30 to correspond to the first fixing holes 220, respectively. Accordingly, the first coupling members 411 may be inserted through the first and second fixing holes 220 and 320 and coupled with the second coupling members 412 on the bottom surface of the mechanical part 30, and the PCB 20 may be secured to the mechanical part 30. As a result, the ground of the PCB 20 may make electrical contact with the mechanical part 30 through the first and second coupling members 411 and 412 and the first and second fixing holes 220 and 320.

According to an embodiment of the present disclosure, at least one contact element 10 may be mounted on the outer peripheral ground of the PCB 20 between the first fixing holes 220 so as not to overlap the first fixing holes 220 of the PCB 20. Accordingly, the contact element 10 mounted on the PCB 20 may make contact with the projection 310 of the mechanical part 30 to electrically connect the ground of the PCB 20 with the mechanical part 30.

According to an embodiment of the present disclosure, the protrusion 120 of the contact element 10 and the projection 310 of the mechanical part 30 may have a shape that allows the contact area between the contact element 10 and the mechanical part 30 to be increased. For example, the protrusion 120 of the contact element 10 may extend from the contact part 110 with a slope less than 90 degrees, and the projection 310 may have an arch shape (see FIG. 4B) or a frusto-pyramidal shape (see, e.g., FIG. 3A). In this case, the protrusion 120 of the contact element 10 may pass through the hole 213 of the PCB 20 and may make close contact with a non-horizontal side surface of the projection 310 on the mechanical part 30 with a specific slope with respect to the horizontal line of the projection 310. In another example, the protrusion 120 of the contact element 10 may extend vertically downward from the contact part 110 and may then be bent, for example, in the semi-U shape (see FIG. 4C). In yet another example, the protrusion 120 of the contact element 10 may extend vertically downward from the contact part 110 and may then be bent, for example, in the shape of "¬" (see FIG. 4D). Therefore, according to various embodiments of the present disclosure, it is possible to increase the contact area between the contact element 10 and the mechanical part 30.

According to an embodiment of the present disclosure, at least the protrusion 120 of the contact element 10 and the hole 213 of the PCB 20 may be formed to allow the contact element 10 to deform freely. For example, at least the protrusion 120 of the contact element 10 may be formed of an elastic material. The hole 213 of the PCB 20 may have a shape and size that allows the protrusion 120 of the contact element 10 to be inserted into the hole 213 by an automated process. Furthermore, the hole 213 of the PCB 20 may have a shape and size that allows the protrusion 120 of the contact element 10 to be inserted into the hole 213 and then bent between the mechanical part 30 and the PCB 20 to make electrical contact with the mechanical part 30. According to various embodiments of the present disclosure, when the protrusion 120 of the contact element 10 is deformed by pressure caused by the PCB 20 placed on the mechanical part 30, the protrusion 120 may increase the contact area between the contact element 10 and the mechanical part 30, and may not be easily broken by an external shock (pressing).

According to another embodiment of the present disclosure, components for functions of an electronic device may be mounted on the second layer of the PCB 20, as well as on the first layer thereof. In this case, the contact element 10 may be mounted in further consideration of the positions of the components mounted on the second layer of the PCB 20. The mechanical part 30 may be configured to prevent an unintended short-circuit that may be caused by contact with the components mounted on the second layer of the PCB 20. For example, the projection 310 may be formed in a region that does not make contact with the components mounted on the second layer of the PCB 20. Furthermore, portions of the mechanical part 30 that make contact with the components mounted on the second layer of the PCB 20 may be formed of a non-conductive material. In the case where the entire mechanical part 30 is formed of a conductive material, the mechanical part 30 may have a shape in which the portions of the mechanical part 30 that overlap or make contact with the components mounted on the second layer of the PCB 20 are cut away or otherwise removed.

According to various embodiments of the present disclosure, a process error rate, as well as process cost and time, may be reduced by allowing the ground of the PCB to make contact with the mechanical part using the contact element mounted on the PCB by SMT.

FIG. 5A illustrates a contact structure for allowing the ground of the PCB to make electrical contact with the mechanical part using only the coupling members, and FIG. 5B illustrates a contact structure for allowing the ground of the PCB to make contact with the mechanical part using the coupling members and the contact element according to an embodiment of the present disclosure.

When the ground of the PCB 20 makes contact with the mechanical part 30 using the contact element 10, in addition to the first and second coupling members 411 and 412, as illustrated in FIG. 5B, a return path of noise generated from the PCB 20 may be reduced, as compared with when the ground of the PCB 20 makes contact with the mechanical part 30 using only the first and second coupling members 411 and 412, as illustrated in FIG. 5A. Therefore, according to various embodiments of the present disclosure, it is possible to reduce signal fluctuation on the PCB 20 and noise radiation therefrom.

FIG. 6 is a graph comparing the EMI characteristic of a first case electrically contacting the ground of the PCB and the mechanical part by using only the coupling members, and the EMI characteristic of a second case electrically contacting the ground of the PCB and the mechanical part by using the coupling members and the contact element according to an embodiment of the present disclosure.

As can be seen from FIG. 6, electro-magnetic interference (EMI) may be further reduced when the contact element 10 according to an embodiment of the present disclosure is employed than when the contact element 10 is not employed (see the changed EMI characteristics in circles of FIG. 6). As described above, according to various embodiments of the present disclosure, a signal return path may be reduced by the contact element, thereby preventing noise on the PCB.

A contact structure for an electronic device according to one aspect of the present disclosure may include: a printed circuit board (PCB); and at least one contact element mounted on the PCB by surface mount technology (SMT). The contact element may be formed of a conductive material, and may include a contact portion, e.g., a contact part brought into contact with the PCB and a protrusion extending from the contact part. The PCB may have at least one mounting portion on which the at least one contact element may be mounted, and the mounting portion may include: a plurality of pads formed on a ground of the PCB, wherein the contact part may be soldered on the plurality of pads; and a hole between the plurality of pads, wherein the protrusion may be inserted into the hole.

According to an embodiment of the present disclosure, the protrusion may make contact with a conductive material of a mechanical part through the hole of the PCB. The protrusion may extend from a coupling portion where a first region and a plurality of second regions join together, in a direction away from the contact part. The protrusion may have a length exceeding the thickness of the PCB. The protrusion may have a width corresponding to the gap between the second regions. The protrusion may extend from the contact part at an angle of, e.g., with a slope less than 90 degrees with respect to the contact part. The protrusion of the contact element may be formed of an elastic material.

According to an embodiment of the present disclosure, the contact part may include: a first region having a specified polygonal shape; and a plurality of second regions extending from the first region, wherein the plurality of second regions may be spaced apart from one another to abut the first region.

The hole formed in the PCB may have a width in a first direction greater than or equal to the width of the protrusion and a width in a second direction greater than or equal to the horizontal gap between first and second ends of the protrusion joined to the coupling portion.

The mechanical part may make electrical contact with the ground of the PCB by securing the PCB to the mechanical part using a plurality of coupling members in a state in which the mechanical part makes close contact with a second surface of the PCB that is opposite to a first surface thereof that makes close contact with the bottom surface of the contact part, and the mounting portion may be formed between the plurality of coupling members. The mechanical part may include at least one projection formed to face toward the second surface of the PCB. The protrusion may make contact with a side surface of the projection. The protrusion may be bent in a shape corresponding to the side surface of the projection. The projection may be formed at multiple positions to balance the PCB on the mechanical part, and the mounting portion may be formed at the positions of the PCB that correspond to the plurality of projections.

A contact element according to another aspect of the present disclosure may include at least one contact element mounted on a ground of a printed circuit board (PCB) by surface mount technology (SMT). The contact element may be formed of a conductive material and may include a contact part brought into contact with the PCB and a protrusion extending from the contact part, and the protrusion may make contact with a conductive material of a mechanical part through a hole formed in the PCB.

The contact part may include a first region having a specified polygonal shape and a plurality of second regions extending from the first region, wherein the plurality of second regions may be spaced apart from one another to abut the first region, and the protrusion may extend from a coupling portion where the first region and the plurality of second regions join together, in a direction away from the contact part.

The protrusion may have a width corresponding to the gap between the plurality of second regions and a length exceeding the thickness of the PCB. The protrusion may have a width corresponding to the gap between the second regions. The first region may have an area sufficient to enable a pick-and-place machine to pick up the same in SMT.

The protrusion may extend from the contact part with a slope less than 90 degrees with respect to the contact part and may be formed of an elastic material.

The hole formed in the PCB may have a width in a first direction greater than or equal to the width of the protrusion and a width in a second direction greater than or equal to the horizontal gap between first and second ends of the protrusion joined to the coupling portion.

According to embodiments of the present disclosure, it is easy to allow the housing ground and the PCB ground to make contact with each other.

A module or a program module according to an embodiment of the present disclosure may include at least one of the above elements, or a part of the above elements may be omitted, or additional other elements may be further included. Operations performed by a module, a program module, or other elements may be executed sequentially, in parallel, repeatedly, or in a heuristic method. In addition, some operations may be executed in different sequences or may be omitted. Alternatively, other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A contact structure for an electronic device, the contact structure comprising:
    a printed circuit board (PCB) having a hole;
    a housing on which the PCB is mounted; and
    a contact element, at least a portion of which contacts the housing,
    wherein the contact element comprises:
        a contact portion soldered onto a peripheral portion of the PCB, the peripheral portion being disposed around the hole; and
        a protrusion passing through the hole and contacting the housing,
    wherein the housing comprises a projection configured to project toward a surface of the PCB, and
    wherein the protrusion contacts a side surface of the projection.

2. The contact structure of claim 1,
    wherein the PCB further comprises a plurality of pads formed on a ground of the PCB, and
    wherein the contact portion is configured to be soldered onto the plurality of pads.

3. The contact structure of claim 1, wherein the contact portion comprises:
    a first region having a specified polygonal shape and a plurality of second regions extending from the first region, the plurality of second regions being spaced apart from one another to abut the first region,
    wherein the protrusion extends from a coupling portion where the first region and the plurality of second regions join together, in a direction away from the contact portion.

4. The contact structure of claim 3, wherein the hole has a first width in a first direction and a second width in a second direction, the second direction being orthogonal to the first direction,
    wherein the first width is greater than or equal to a width of the protrusion in the first direction, and
    wherein the second width is greater than or equal to a distance between first and second ends of the protrusion in the second direction.

5. The contact structure of claim 3, wherein the protrusion has a width corresponding to a gap between the plurality of second regions.

6. The contact structure of claim 1, wherein the protrusion of the contact element has an elastic force.

7. The contact structure of claim 1, wherein the housing is secured to the PCB using a plurality of coupling members,
    wherein the housing contacts a ground of the PCB using the plurality of coupling members, and
    wherein the contact element is located between the plurality of coupling members.

8. The contact structure of claim 1, wherein the protrusion is bent in a shape corresponding to the side surface of the projection.

9. The contact structure of claim 1, wherein the housing further comprises a plurality of projections formed at multiple positions to balance the PCB on the housing, and
    wherein the contact structure further comprises a plurality of contact elements formed at a plurality of positions on the PCB that correspond to the plurality of projections.

10. The contact structure of claim 1, wherein the peripheral portion is disposed on an other side of the PCB opposite to a side of the PCB which contacts the housing.

11. The contact structure of claim 1, wherein the contact element includes cuts extending from a short edge thereof, the cuts defining the protrusion, and
    wherein the protrusion extends obliquely with respect to a plane of the contact portion.

12. A contact element comprising:
    a contact portion disposed on a side of a hole in a printed circuit board (PCB) and soldered onto a peripheral portion of the PCB, the peripheral portion being disposed around the hole; and
    a protrusion passing through the hole and contacting a housing on which the PCB is mounted,
    wherein the protrusion contacts a side surface of a projection of the housing, the projection being configured to project toward a surface of the PCB.

13. The contact element of claim 12, wherein the protrusion extends from the contact portion at an angle of less than 90 degrees with respect to the contact portion.

14. The contact element of claim 12, wherein the peripheral portion is disposed on an other side of the PCB opposite to a side of the PCB which contacts the housing.

15. The contact element of claim 12, wherein the contact element includes cuts extending from a short edge thereof, the cuts defining the protrusion, and
    wherein the protrusion extends obliquely with respect to a plane of the contact portion.

16. A contact element comprising:
    a contact portion disposed on a side of a hole in a printed circuit board (PCB) and soldered onto a peripheral portion of the PCB, the peripheral portion being disposed around the hole; and a protrusion passing through the hole and contacting a housing disposed on a side of the PCB and facing the hole, the PCB being seated on the housing, wherein the contact portion comprises a first region having a specified polygonal shape and a plurality of second regions extending from the first region, the plurality of second regions being spaced apart from one another to abut the first region, and wherein the protrusion extends from a coupling portion where the first region and the plurality of second regions join together, in a direction away from the contact portion.

17. The contact element of claim 16, wherein the protrusion has a width corresponding to a gap between the plurality of second regions and a length exceeding a thickness of the PCB.

18. The contact element of claim 17, wherein the hole has a first width in a first direction and a second width in a second direction, the second direction being orthogonal to the first direction, wherein the first width is greater than or equal to a width of the protrusion in the first direction, and wherein the second width is greater than or equal to a distance between first and second ends of the protrusion in the second direction.

19. The contact element of claim 16, wherein the protrusion has a width corresponding to a gap between the plurality of second regions.

20. The contact element of claim 16, wherein the first region has an area sufficient to enable a pick-and-place machine to pick up the contact element using surface mount technology (SMT).

* * * * *